(12) United States Patent
Tang et al.

(10) Patent No.: US 11,749,320 B2
(45) Date of Patent: Sep. 5, 2023

(54) STORAGE DEVICE AND CONTROL METHOD THEREOF

(71) Applicant: Vanguard International Semiconductor Corporation, Hsinchu (TW)

(72) Inventors: Po-Yuan Tang, Hsinchu (TW); Yang-Sen Yeh, Baoshan Township (TW); Hsuan-Chi Su, Cyonglin Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 6 days.

(21) Appl. No.: 17/554,512

(22) Filed: Dec. 17, 2021

(65) Prior Publication Data

US 2023/0197126 A1 Jun. 22, 2023

(51) Int. Cl.
*G11C 7/10* (2006.01)

(52) U.S. Cl.
CPC .......... *G11C 7/1096* (2013.01); *G11C 7/1069* (2013.01)

(58) Field of Classification Search
CPC ............................ G11C 7/1096; G11C 7/1069
USPC ..................................................... 365/189.15
See application file for complete search history.

(56) References Cited

U.S. PATENT DOCUMENTS

| 9,165,658 | B2 | 10/2015 | Sarpatwari et al. |
| 2005/0185464 | A1 | 8/2005 | Chih |
| 2006/0279985 | A1* | 12/2006 | Keshavarzi ........... G11C 11/404 365/177 |
| 2013/0088916 | A1* | 4/2013 | Sarpatwari ............ G11C 16/10 365/185.02 |

OTHER PUBLICATIONS

Taiwanese Office Action and Search Report for Taiwanese Application No. 110135513, dated Aug. 23, 2022.

* cited by examiner

Primary Examiner — Huan Hoang
(74) Attorney, Agent, or Firm — Birch, Stewart, Kolasch & Birch, LLP

(57) ABSTRACT

A storage device including a cell array and a disturb-free circuit is provided. The cell array includes a first cell and a second cell. The first cell is coupled to a first conductive line and a specific conductive line. The second cell is coupled to a second conductive line and the specific conductive line. The disturb-free circuit performs a first write operation on the first cell and performs a verification operation on the second cell. The verification operation determines whether data stored in the second cell is disturbed by the first write operation. In response to the data stored in the second cell being disturbed by the first write operation, the disturb-free circuit performs a second write operation.

20 Claims, 5 Drawing Sheets

US 11,749,320 B2

STORAGE DEVICE AND CONTROL METHOD THEREOF

BACKGROUND OF THE INVENTION

Field of the Invention

The invention relates to a storage device, and more particularly to a storage device which has the function of compensating for write disturbances.

Description of the Related Art

Generally, memory comprises volatile memory and a non-volatile memory. The type of memory whose data will disappear when the supply of power is interrupted is referred to as volatile memory. The memory whose data does not disappear when power is interrupted is referred to as non-volatile memory. When a write operation is performed on non-volatile memory, the data stored in the memory may be disturbed by the write operation.

BRIEF SUMMARY OF THE INVENTION

In accordance with an embodiment of the disclosure, a storage device comprises a cell array and a disturb-free circuit. The cell array comprises a first cell and a second cell. The first cell is coupled to a first conductive line and a specific conductive line. The second cell is coupled to a second conductive line and the specific conductive line. The disturb-free circuit performs a first write operation on the first cell and performs a verification operation on the second cell. The verification operation determines whether data stored in the second cell is disturbed by the first write operation. In response to the data stored in the second cell being disturbed by the first write operation, the disturb-free circuit performs a second write operation.

A control method for a storage device is provided. The storage device comprises a cell array which comprises a plurality of cells. An exemplary embodiment of the control method is described in the following paragraph. One of the cells is selected. A first write operation is performed on the selected cell. A verification operation is performed on an un-selected cell among the cells to determine whether data stored in the un-selected cell is disturbed by the first write operation. In response to the data stored in the un-selected cell being disturbed by the first write operation, a second write operation is performed on the un-selected cell. The un-selected cell and the selected cell are coupled to a specific conductive line.

Control methods may be practiced by the systems which have hardware or firmware capable of performing particular functions and may take the form of program code embodied in a tangible media. When the program code is loaded into and executed by an electronic device, a processor, a computer or a machine, the electronic device, the processor, the computer or the machine becomes a storage device for practicing the disclosed method.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
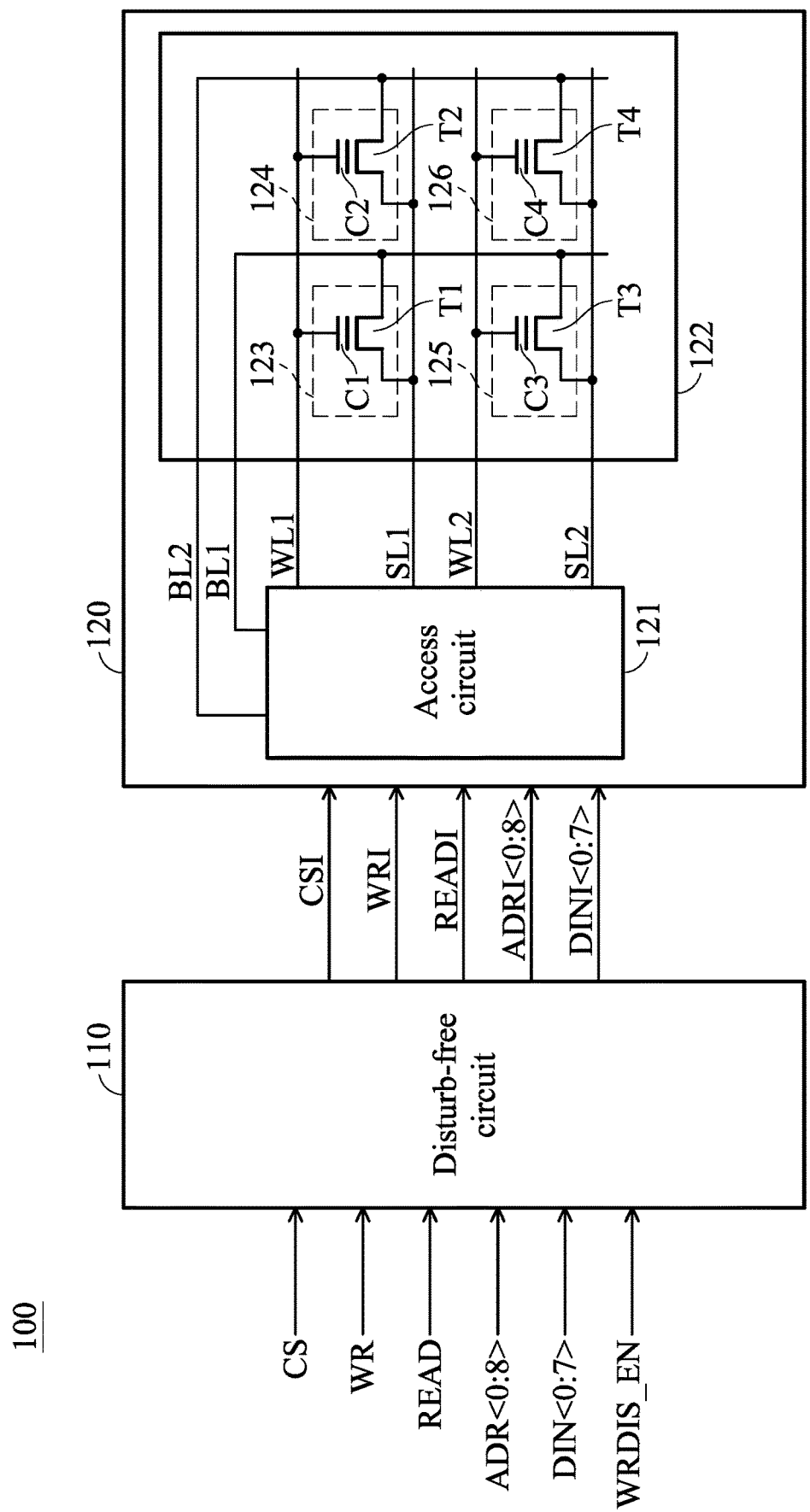
FIG. 1 is a schematic diagram of an exemplary embodiment of a storage device according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a storage device according to various aspects of the present disclosure. The storage device 100 comprises a disturb-free circuit 110 and a memory 120. The disturb-free circuit 110 receives a chip select signal CS, a write signal WR, a read signal READ, an address ADR<0:8>, write data DIN<0:7>, and a compensation signal WRDIS_EN. The disturb-free circuit 110 further generates a chip select signal CSI, a write signal WRI, a read signal READI, an address ADRI<0:8>, and write data DINI<0:7>.

In one embodiment, when the compensation signal WRDIS_EN is not enabled, the disturb-free circuit 110 enters a normal access mode. In the normal access mode, the disturb-free circuit 110 may use the chip select signal CS, the write signal WR, the read signal READ, the address ADR<0:8>, and the write data DIN<0:7> as the chip select signal CSI, the write signal WRI, the read signal READI, the address ADRI<0:8>, and the write data DINI<0:7>.

When the compensation signal WRDIS_EN is enabled, the disturb-free circuit 110 enters a compensation access mode. In the compensation access mode, the disturb-free circuit 110 directs the memory 120 to perform a read operation or a write operation according to the read signal READ and the write signal WR. For example, if the read signal READ is enabled, the disturb-free circuit 110 uses the read signal READ and the address ADR<0:8> as the read signal READI and the address ADRI<0:8> to direct the memory 120 to perform a read operation. If the write signal WR is enabled, the disturb-free circuit 110 uses the write signal WR, the address ADR<0:8>, and the write data DIN<0:7> as the write signal WRI, the address ADRI<0:8>, and the write data DINI<0:7>. In this case, the memory 120 performs a first write operation. After finishing the first write operation, the disturb-free circuit 110 temporarily ignores the read signal READ and the write signal WR and directly performs a verification operation on the memory 120 to determine whether the data stored in the memory 120 is disturbed by the first write operation. If the data stored in a specific cell of the memory 120 is disturbed by the first write operation, the disturb-free circuit 110 directs the memory 120 to perform a second write operation on the specific cell until the memory 120 restores the data stored in the specific cell.

The kind of memory 120 is not limited in the present disclosure. In one embodiment, the memory 120 is a non-volatile memory (NVM), such as a one-time programmable non-volatile memory (OTP NVM), a multi-time programmable non-volatile memory (MTP NVM), a flash memory, a magneto-resistive random access memory (MRAM) or a resistive random access memory (RRAM).

In this embodiment, the memory 120 comprises an access circuit 121 and a cell array 122. The cell array 122 comprises cells 123~126, but the disclosure is not limited thereto. In other embodiment, the cell array 122 comprises more or fewer cells. In this embodiment, each of the cells 123~126 comprises a capacitor and a transistor, but the disclosure is not limited thereto. In other embodiments, each cell comprises more capacitors or more transistors.

As shown in FIG. 1, the cell 123 comprises a capacitor C1 and a transistor T1. The capacitor C1 is coupled between a word line WL1 and the gate of the transistor T1. The drain of the transistor T1 is coupled to a bit line BL1. The source of the transistor T1 is coupled to a source line SL1. The cell 124 comprises a capacitor C2 and a transistor T2. The capacitor C2 is coupled between the word line WL1 and the gate of the transistor T2. The drain of the transistor T2 is coupled to a bit line BL2. The source of the transistor T2 is coupled to the source line SL1. The cell 125 comprises a capacitor C3 and a transistor T3. The capacitor C3 is coupled between a word line WL2 and the gate of the transistor T3. The drain of the transistor T3 is coupled to the bit line BL1. The source of the transistor T3 is coupled to a source line SL2. The cell 126 comprises a capacitor C4 and a transistor T4. The capacitor C4 is coupled between the word line WL2 and the gate of the transistor T4. The drain of the transistor T4 is coupled to the bit line BL2. The source of the transistor T4 is coupled to the source line SL2.

The access circuit 121 controls the voltages of the word lines WL1 and WL2, the bit lines BL1 and BL2, and the source lines SL1 and SL2 according to the chip select signal CSI, the write signal WRI, the read signal READI, the address ADRI<0:8>, and the write data DINI<0:7> to perform a write operation or a read operation on a corresponding cell. For example, when the read signal READI is enabled, the access circuit 121 performs a read operation on the cell array 122. Assume that the address ADRI<0:8> corresponds to the cell 123. In this case, the access circuit 121 may set the voltage of the word line WL1 to a first voltage, the voltage of the bit line BL1 to a second voltage, and the voltage of the source line SL1 to a third voltage to select the cell 123. The magnitude between the first, second, and third voltages is not limited in the present disclosure. In some embodiments, the first voltage is higher than the second voltage, and the second voltage is higher than the third voltage. For example, the first voltage is 2 V, the second voltage is 1 V, and the third voltage is 0 V. In such cases, since the access circuit 121 does not perform the read operation on the cells 124~126, the access circuit 121 sets the voltages of the word line WL2, the bit line BL2 and source line BL2 coupled to the cells 124~126 to un-select the cells 124~126. In one embodiment, the access circuit 121 sets the voltage of the bit line BL2 to a fourth voltage. In one embodiment, the access circuit 121 may not provide any voltage to the bit line BL2 such that the voltage of the bit line BL2 is a floating voltage. Additionally, the access circuit 121 may set the voltage of the word line WL2 to a fifth voltage and set the voltage of the source line SL2 to a sixth voltage. In one embodiment, the fifth voltage is equal to the third voltage. Furthermore, the sixth voltage may be equal to the fourth voltage.

In another embodiment, when the write signal WRI is enabled, the access circuit 121 performs a write operation on the cell array 122. In this embodiment, the write operation comprises am erase operation and a program operation. For example, when the access circuit 121 intends to write the value 1 to the cell 123, the access circuit 121 performs an erase operation on the cell 123. When the access circuit 121 intends to write a value 0 to the cell 123, the access circuit 121 performs a program operation on the cell 123.

Taking the cell 123 as an example, if the access circuit 121 intends to perform an erase operation on the cell 123, the access circuit 121 sets the voltage of the word line WL1 to a seventh voltage, the voltage of the bit line BL1 to a eighth voltage and the voltage of the source line SL1 to a ninth voltage. In this case, the cell 123 stores the value 1. In one embodiment, the seventh voltage is the same as the ninth voltage and less than the eighth voltage. For example, the seventh voltage and the ninth voltage are 0 V, and the eighth voltage is 9.5 V. In this case, since the access circuit 121 does not perform the erase operation on the cells 124~126, the access circuit 121 sets the voltages of the word line WL2, the bit line BL2 and the source line SL2 to un-select the cells 124~126. In one embodiment, the access circuit 121 sets the voltage of the bit line BL2 to a tenth voltage. In one embodiment, the tenth voltage is equal to the fourth voltage. Additionally, the access circuit 121 may set the voltage of the word line WL2 to an eleventh voltage and the voltage of the source line SL2 to a twelfth voltage. In one embodiment, the eleventh voltage is equal to the twelfth voltage, such as 5 V.

In other embodiments, if the access circuit 121 intends to perform a program operation on the cell 123, the access circuit 121 sets the voltage of the word line WL1 to a thirteenth voltage, the voltage of the bit line BL1 to a fourteenth voltage and the voltage of the source line SL1 to a fifteenth voltage. In this case, the cell 123 stores the value 0. In one embodiment, the thirteenth voltage is the same as the fourteenth voltage and higher than the fifteenth voltage. For example, the thirteenth voltage and the fourteenth voltage are 9.5 V, and the fifteenth voltage is 2 V. In this case, since the access circuit 121 does not perform the program operation on the cells 124~126, the access circuit 121 sets the voltages of the word line WL2, the bit line BL2 and the source line SL2 to un-select the cells 124~126. In one embodiment, the access circuit 121 sets the voltage of the bit line BL2 to a sixteenth voltage. In one embodiment, the sixteenth voltage is equal to the fourth voltage. Additionally, the access circuit 121 may set the voltage of the word line WL2 to a seventeenth voltage and the voltage of the source line SL2 to an eighteenth voltage. In one embodiment, the seventeenth voltage is equal to the eighteenth voltage, such as 5 V.

However, when the access circuit 121 selects a specific cell to perform a write operation (an erase operation or a program operation), the voltages of the word line and the bit line of the selected specific cell disturb the data stored in other un-selected cells. Taking the cell 123 as an example, when the access circuit 121 performs a write operation on the cell 123, since the cell 124 is also coupled to the word line WL1, the voltage of the word line WL1 disturbs the data stored in the cell 124. In some embodiments, the data stored in the cell 124 may be changed from the value 0 to the value 1 or from the value 1 to the value 0 due to the voltage of the word line WL1. Similarly, since the cells 125 and 123 are coupled to the same bit line BL1, the voltage of the bit line BL1 may disturb the data stored in the cell 125.

To avoid the un-selected cell from being disturbed by the write operation, after the access circuit 121 writes data in the cell 123, the disturb-free circuit 110 performs a verification operation on at least one un-selected cell. The un-selected cell and the selected cell are coupled to the same word line or bit line. Taking FIG. 1 as an example, assume that the access circuit 121 selects the cell 123 which is coupled to the word line WL1. In this case, after the access circuit 121 performs a write operation on the cell 123, the disturb-free circuit 110 directs the access circuit 121 to perform a verification operation on an un-selected cell which is coupled to the word line WL1. In other embodiments, when the word line WL1 is coupled to many cells, the access circuit 121 sequentially performs the verification operation on cells which are coupled to the word line WL1.

In some embodiments, after the access circuit 121 selects the cell 123 coupled to the bit line BL1 and performs a write operation on the cell 123, the disturb-free circuit 110 directs the access circuit 121 to perform a verification operation on the un-selected cell (e.g., the cell 125) coupled to the bit line BL1. In other embodiments, when many cells are coupled to the bit line BL1, the access circuit 121 sequentially performs the verification operation on each cell which is coupled to the bit line BL1.

In other embodiments, after the access circuit 121 performs the write operation on the cell 123, the disturb-free circuit 110 directs the access circuit 121 to perform a verification operation on the un-selected cells which may be coupled to the word line WL1 or the bit line BL1. In such cases, the access circuit 121 may perform the verification operation on the un-selected cells coupled to the word line WL1 and then perform the verification operation on the un-selected cells coupled to the bit line BL1.

In this embodiment, the verification operation is to determine whether the data stored in the un-selected cells are disturbed by the write operation. The present disclosure does not limit how the access circuit 121 determines whether the data stored in the un-selected cells are disturbed by the write operation. In one embodiment, the access circuit 121 reads the data stored in an un-selected cell and the cell current Icell of the un-selected cell. Then the access circuit 121 selects a threshold according to the data stored in the un-selected cell and then compares the cell current Icell of the un-selected cell with the threshold value. In one embodiment, when the data stored in the un-selected cell is the value 1, the access circuit 121 compares the cell current Icell of the un-selected cell with an erase threshold value. When the data stored in the un-selected cell is the value 0, the access circuit 121 compares the cell current Icell of the un-selected cell with a program threshold value. The access circuit 121 determine whether the data stored in the un-selected cell is disturbed by the write operation according to the compared result.

Figure 2A:
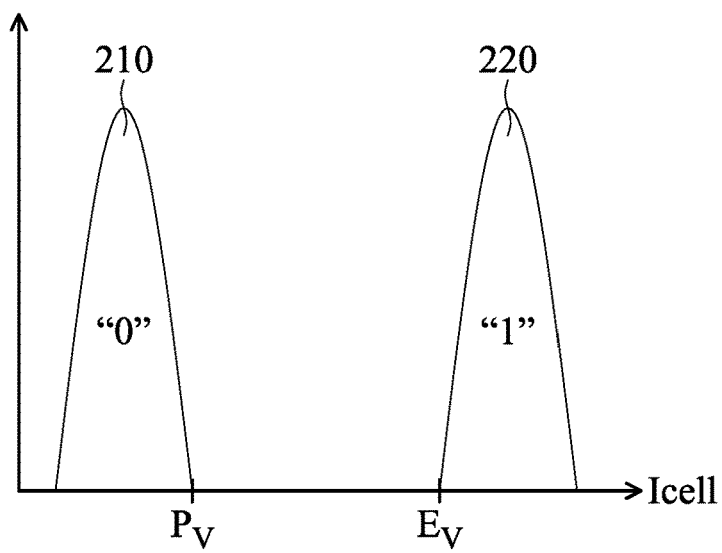
FIG. 2A-2C are schematic diagrams of exemplary embodiments of a cell current according to various aspects of the present disclosure.
Figure 2B:
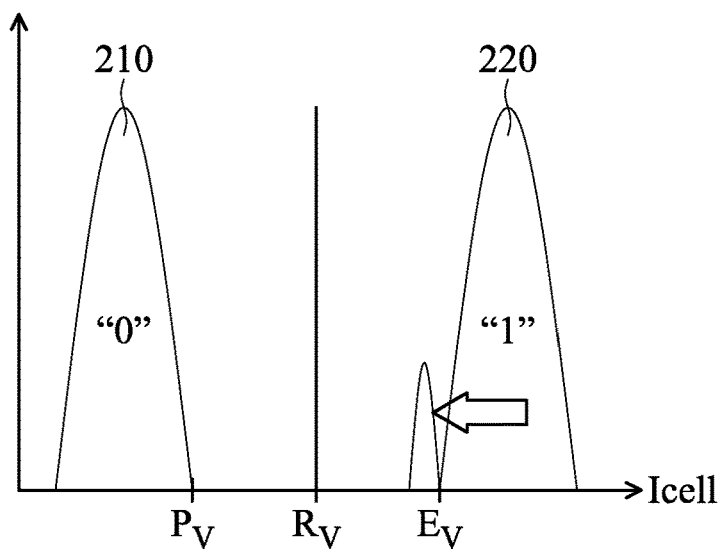
Figure 2C:
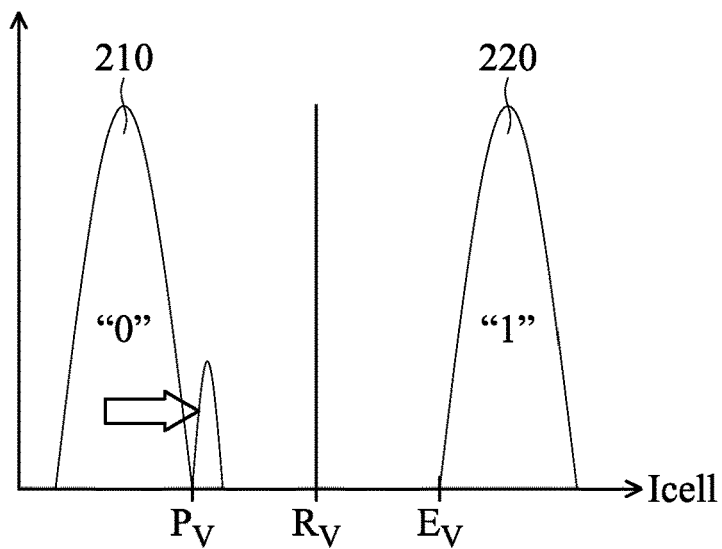

FIG. 2A~2C are schematic diagrams of exemplary embodiments of the cell current Icell according to various aspects of the present disclosure. In FIG. 2A, when the data stored in one un-selected cell is the value 0, the cell current Icell of the un-selected cell is within a program range 210. When the data stored in one un-selected cell is the value 1, the cell current Icell of the un-selected cell is within an erase range 220.

In FIG. 2B, since an un-selected cell is interfered by a write disturbance, the cell current Icell of the un-selected cell deviates from the erase range 220. In this case, since the cell current Icell of the un-selected cell is higher than a reference current Rv, the access circuit 121 determines that the data stored in the un-selected cell is the value 1. Therefore, the access circuit 121 compares the cell current Icell of the un-selected cell and an erase threshold Ev. Since the cell current Icell of the un-selected cell is less than the erase threshold Ev, the access circuit 121 determines that the data stored in the un-selected cell is interfered by the write disturbance.

In this case, if the un-selected cell is not compensated immediately, the cell current Icell of the un-selected cell may gradually approach the program range 210. When the cell current Icell of the un-selected cell enters the program range 210, the data stored in the un-selected cell may be changed from the value 1 to the value 0. To compensate the un-selected cell, the disturb-free circuit 110 directs the access circuit 121 to perform a write operation on the un-selected cell. In this case, since the data stored in the un-selected cell is the value 1, the access circuit 121 performs an erase operation on the un-selected cell. In some embodiments, the erase operation has a verify step to determine whether the cell current Icell of the un-selected cell goes back to the erase range 220. If the cell current Icell of the un-selected cell does not go back to the erase range 220, the access circuit 121 performs the erase operation on the un-selected cell again until the cell current Icell of the un-selected cell goes back to the erase range 220.

In FIG. 2C, since the un-selected cell is interfered by the write disturbance, the cell current Icell of the un-selected cell deviates from the program range 210. In this case, since the cell current Icell of the un-selected cell is less than the reference current Rv, the access circuit 121 determines that the data stored in the un-selected cell is the value 0. Therefore, the access circuit 121 compares the cell current Icell of the un-selected cell and a program threshold Pv. Since the cell current Icell of the un-selected cell is higher than the program threshold Pv, the access circuit 121 determines that the data stored in the un-selected cell is not interfered with the write disturbance.

In this case, if the un-selected cell is not compensated immediately, the cell current Icell of the un-selected cell may gradually approach the erase range 220. When the cell current Icell of the un-selected cell enters the erase range 220, the data stored in the un-selected cell may be changed from the value 0 to the value 1. To compensate the un-selected cell, the disturb-free circuit 110 directs the access circuit 121 to perform a write operation on the un-selected cell. In this case, since the data stored in the un-selected cell is the value 0, the access circuit 121 performs a program operation on the un-selected cell. In some embodiments, the program operation has a verify step to determine whether the cell current Icell of the un-selected cell goes back to the program range 210. If the cell current Icell of the un-selected cell does not go back to the program range 210, the access circuit 121 performs the program operation on the un-selected cell again until the cell current Icell of the un-selected cell goes back ethe program range 210.

In FIG. 1, the disturb-free circuit 110 is disposed outside of the memory 120, but the disclosure is not limited thereto. In one embodiment, the disturb-free circuit 110 may integrated into the access circuit 121. The disturb-free circuit 110 may be integrated into the memory 120 but disposed independent of the access circuit 121. In this embodiment, the memory 120 writes one bit of data into a cell or reads one bit of data of the cell at a time. In other embodiments, the memory 120 may write more than one bit of data to a corresponding cell or reads more than one bit of data from a corresponding cell.

In some embodiments, since the disturb-free circuit 110 directs the access circuit 121 to perform a verification operation on cells, ensures the correctness of the stored data. Furthermore, the memory 120 performs the verification operation on the un-selected cells on the same word line or the same bit line. Since the memory 120 does not perform the verification operation on all un-selected cells, the power consumption of the memory 120 is reduced.

Figure 3:
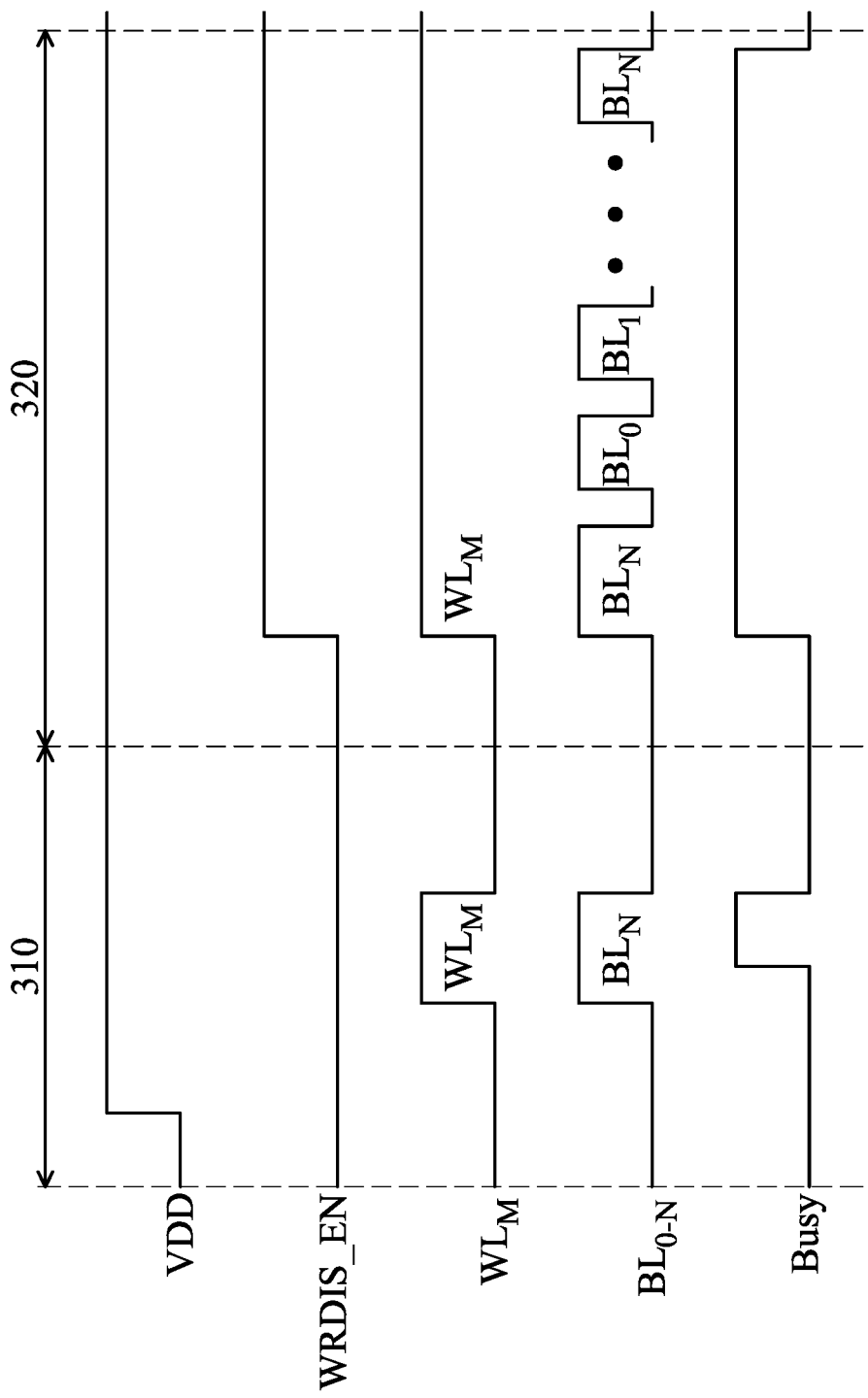
FIG. 3 is an operation schematic diagram of an exemplary embodiment of the storage device according to various aspects of the present disclosure.

FIG. 3 is an operation schematic diagram of an exemplary embodiment of the storage device according to various aspects of the present disclosure. After the storage device 100 receives the voltage VDD, the storage device 100 starts to read external signals, such as CS, WR, READ . . . shown in FIG. 1. To brevity, when a signal of FIG. 3 is at a high level, it means that the signal is enabled. When a signal is at a low level, it means that the signal is not enabled.

In period 310, the compensation signal WRDIS_EN is not enabled. Therefore, the disturb-free circuit 110 enters a normal access mode. In the normal access mode, when the word line $WL_M$ and the bit line $BL_N$ are enabled, the access circuit 121 performs a write operation on the cell (not shown) corresponding to the word line $WL_M$ and the bit line $BL_N$. In this embodiment, the symbols M and N are positive integers.

When the access circuit 121 starts to perform the write operation, a busy signal Busy is enabled. After finishing the write operation, the access circuit 121 does not enable the busy signal Busy. In some embodiments, when the duration for which the busy signal Busy is enabled exceeds a predetermined value, it means that the write operation is fail. In this case, the access circuit 121 may stop performing the write operation or re-perform the write operation on the cell corresponding to the word line $WL_M$ and the bit line $BL_N$.

In period 320, the compensation signal WRDIS_EN is enabled. Therefore, the disturb-free circuit 110 enters a compensation access mode. In the compensation access mode, when the word line $WL_M$ and the bit line $BL_N$ are enabled, the access circuit 121 performs a write operation on the cell corresponding to the word line $WL_M$ and the bit line $BL_N$. After finishing the write operation, the disturb-free circuit 110 directs the access circuit 121 to perform a verification operation on other cells on the word line $WL_M$. In this embodiment, the access circuit 121 performs the verification operation on the cell coupled to the bit lines $BL_0 \sim BL_N$ in order. Therefore, the bit lines $BL_0 \sim BL_N$ are enabled sequentially. In other embodiments, the access circuit 121 may not perform the verification operation on the cell which is coupled to the bit line $BL_N$.

In some embodiments, if the access circuit 121 performs the write operation on the cell coupled to the word line $WL_M$ and the bit line $BL_K$, after finishing the write operation, the access circuit 121 performs the verification operation on each cell which may be coupled to one of the bit lines $BL_0 \sim BL_{K-1}$ and $BL_{K+1} \sim BL_N$. After performing the verification operation on all cells, the access circuit 121 performs the verification operation on the cell coupled to the bit line $BL_K$.

In this embodiment, the access circuit 121 first performs the write operation on the cell corresponding to the word line $WL_M$ and the bit line $BL_N$. Then, the access circuit 121 performs the verification operation on the other cells coupled to the word line $WL_M$. In other embodiments, the access circuit 121 performs the verification operation on the other cells coupled to the bit line $BL_N$. In some embodiments, the access circuit 121 performs the verification operation on the other cells which may be coupled to the word line $WL_M$ or the bit line $BL_N$. In this case, the access circuit 121 may perform the verification operation on all the un-selected cells coupled to the word line $WL_M$ in order and perform the verification operation on all the un-selected cells coupled to the bit line $BL_N$. In another embodiment, the access circuit 121 perform the verification operation on all the un-selected cells coupled to the bit line $BL_N$ and then perform the verification operation on all the un-selected cells coupled to the word line $WL_M$.

In other embodiments, the disturb-free circuit 110 determines whether a specific event occurs. When the specific event does not occur, the disturb-free circuit 110 stops directing the access circuit 121 to perform the verification operation. In one embodiment, the specific event is that the compensation signal WRDIS_EN is enabled. In another embodiment, the specific event is that the number of times that data is written to the cell array 122 reaches a target value.

Figure 4:
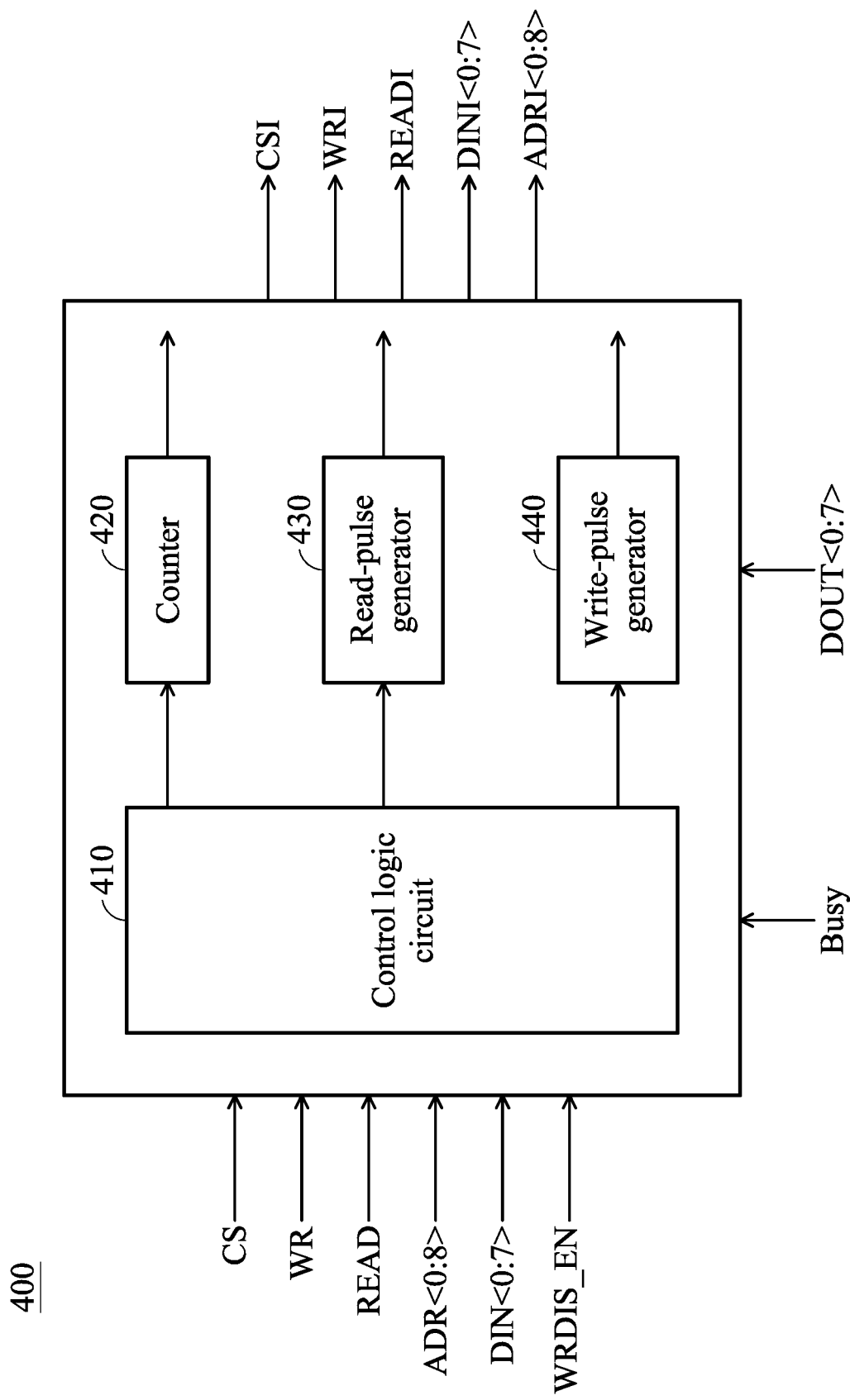
FIG. 4 is a schematic diagram of an exemplary embodiment of a disturb-free circuit according to various aspects of the present disclosure.

FIG. 4 is a schematic diagram of an exemplary embodiment of a disturb-free circuit according to various aspects of the present disclosure. The disturb-free circuit 400 comprises a control logic circuit 410, a counter 420, a read-pulse generator 430, and a write-pulse generator 440. In one embodiment, when the compensation signal WRDIS_EN is not enabled, the control logic circuit 410 directly uses the chip select signal CS, the write signal WR, the read signal READ, the address ADR<0:8>, and the write data DIN<0:7> as the chip select signal CSI, the write signal WRI, the read signal READI, the address ADRI<0:8>, and the write data DINI<0:7>.

In another embodiment, when the compensation signal WRDIS_EN is enabled, the control logic circuit 410 controls the counter 420, the read-pulse generator 430 and the write-pulse generator 440 to adjust the write signal WRI, the read signal READI, the address ADRI<0:8>, and the write data DINI<0:7>. For example, when the read signal READ is enabled, the control logic circuit 410 directly uses the read signal READ and the address ADR<0:8> as the read signal READI and the address ADRI<0:8> to direct the memory 120 to perform a read operation.

In one embodiment, when the write signal WR is enabled, the control logic circuit 410 directly uses the write signal WR, the address ADR<0:8>, and the write data DIN<0:7> as the write signal WRI, the address ADRI<0:8>, and the write data DINI<0:7> to direct the memory 120 to perform a write operation. After finishing the write operation, the control logic circuit 410 triggers the counter 420 to adjust the address ADRI<0:8> so that the memory 120 performs a verification operation on a corresponding cell which may be referred to as an un-selected cell. In this case, the control logic circuit 410 drives the read-pulse generator 430 to direct the memory 120 to read the data DOUT<0:7> stored in the un-selected cell. The control logic circuit 410 drives the write-pulse generator 440 according to the data DOUT<0:7> of the un-selected cell to write data into the un-selected cell. In one embodiment, when the data DOUT<0:7> of the un-selected cell is the value 1, the control logic circuit 410 utilizes the write-pulse generator 440 to direct the memory 120 to perform an erase operation. When the data DOUT<0:7> of the un-selected cell is the value 0, the control logic circuit 410 utilizes the write-pulse generator 440 to direct the memory 120 to perform a program operation.

After finishing the verification operation, the memory 120 disables the busy signal Busy. The control logic circuit 410 re-triggers the counter 420 to direct the memory 120 to read the data stored in next un-selected cell. In this case, when the count value of the counter 420 reaches a target value, it means that the data stored in all un-selected cells are verified. Therefore, the control logic circuit 410 re-determines whether the read signal READ or the write signal WR is enable. In this embodiment, each when the write signal WR is enabled, the control logic circuit 410 directs the memory 120 to perform a write operation and a verification operation.

Figure 5:
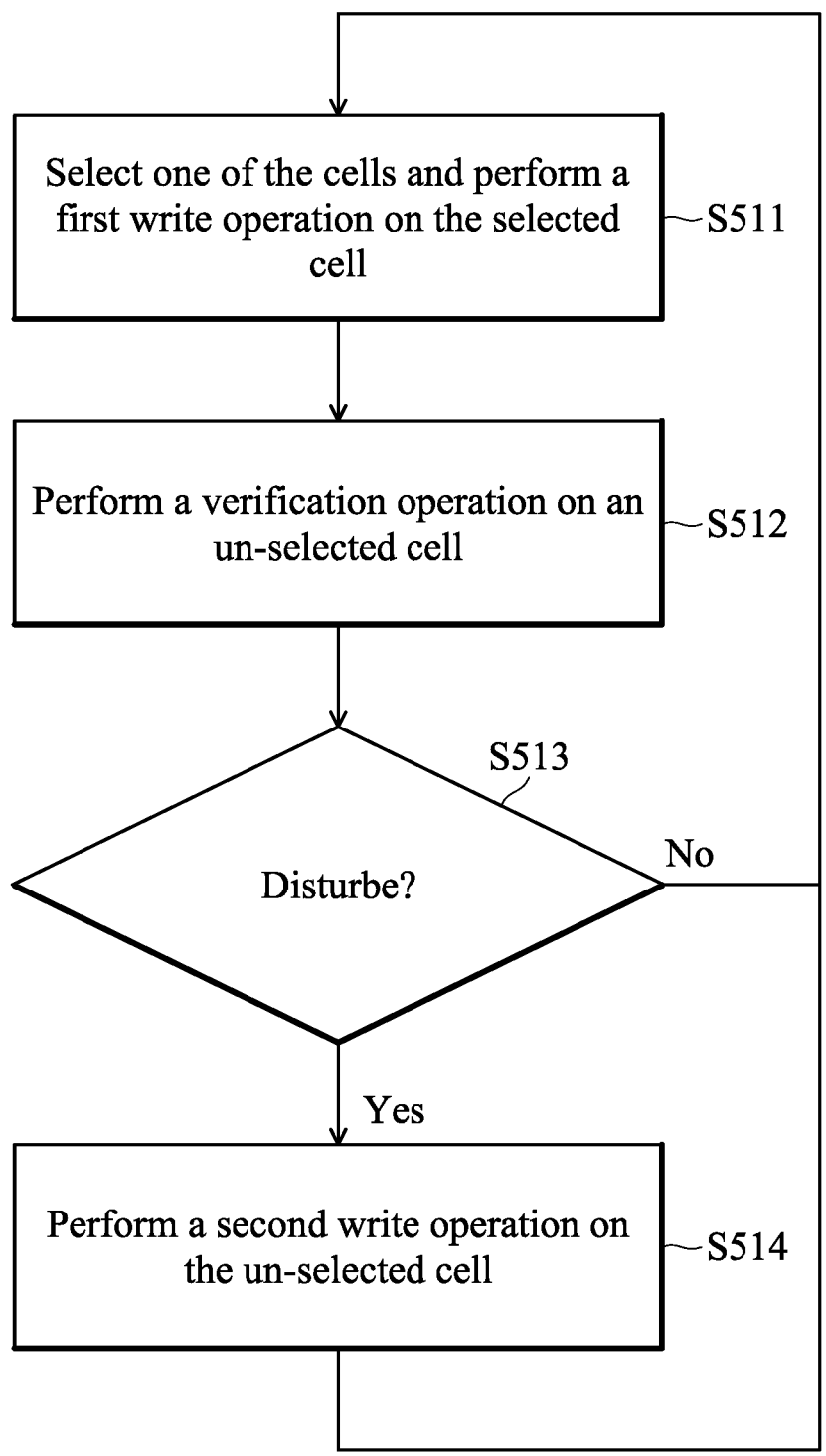
FIG. 5 is a flowchart of an exemplary embodiment of a control method according to various aspects of the present disclosure.

FIG. 5 is a flowchart of an exemplary embodiment of a control method according to various aspects of the present disclosure. The control method is applied in a storage device. The storage device comprises a cell array. The cell array comprises a plurality of cells. First, one of the cells is selected and a first write operation is performed on the selected cell (step S511). In one embodiment, the first write operation comprises an erase operation and a program operation. The erase operation is to write the value 1 into the cell. The program operation is to write the value 0 into the cell.

A verification operation is performed on an un-selected cell to determine whether data stored in the un-selected cell is disturbed by the first write operation (step S512). In this embodiment, the un-selected cell in step S512 and the selected cell in step S511 are coupled to a specific conductive line. In one embodiment, the specific conductive line. In one embodiment, the specific conductive line is a word line or a bit line.

When the data of un-selected cell is disturbed by the first write operation, a second write operation is performed on the un-selected cell (step S514). When the data of un-selected cell is not disturbed by the first write operation, step S511 is executed to perform the first write operation on another cell.

In some embodiments, the verification operation in step S512 is to read the data stored in the un-selected cell and the cell current of the un-selected cell. After obtaining the data stored in the un-selected cell, step S512 is to determine whether the data stored in the un-selected cell is equal to a specific value, such as the value 1.

When the data stored in the un-selected cell is equal to the specific value, step S513 is to determine whether the cell current of the un-selected cell deviates from an erase range. In one embodiment, step S513 compares the cell current of the un-selected cell and an erase threshold (or referred to as a first threshold). When the cell current of the un-selected cell is less than the erase threshold value, it means that the cell current of the un-selected cell deviates from the erase range. Therefore, step S514 performs an erase operation on the un-selected cell until the cell current of the un-selected cell is equal to or higher than the erase threshold value.

When the data stored in the un-selected cell is not equal to the specific value, step S513 is to determine whether the cell current of the un-selected cell deviates from a program range. In one embodiment, step S513 compares the cell current of the un-selected cell and a program threshold (or referred to as a second threshold). When the cell current of the un-selected cell is higher than the program threshold value, it means that the cell current of the un-selected cell deviates from the program range. Therefore, step S514 performs a program operation on the un-selected cell until the cell current of the un-selected cell is equal to or less than the program threshold value.

In this embodiment, when the data stored in the un-selected cell is not disturbed by the first write operation or the cell current of the un-selected cell goes back to the corresponding range, step S511 is executed to perform a write operation on another cell. In some embodiment, after step S514, the verification operation is performed on the selected cell. In this case, after performing the verification operation on the selected cell, step S511 is executed to perform the write operation on another cell.

In other embodiments, before step S511, a determination is made as to whether a specific event occurs. When no specific event occurs, the verification operation is not performed. Therefore, after the data is written into the corresponding cell, the verification operation is not performed on other cells that are coupled to the same word line or the same bit line. In one embodiment, the specific event is that the number of times that the data is written to the cell array reaches a target value, such as 100 times.

Control methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes a storage device for practicing the methods. The control methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes a storage device for practicing the disclosed methods. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:
1. A storage device comprising:
a cell array comprising a first cell and a second cell, wherein the first cell is coupled to a first conductive line and a specific conductive line, and the second cell is coupled to a second conductive line and the specific conductive line; and
a disturb-free circuit performing a first write operation on the first cell and performing a verification operation on the second cell,
wherein:

the verification operation determines whether data stored in the second cell is disturbed by the first write operation, and in response to the data stored in the second cell being disturbed by the first write operation, the disturb-free circuit performs a second write operation on the second cell.

2. The storage device as claimed in claim 1, wherein the disturb-free circuit reads a cell current of the second cell and determines whether the data stored in the second cell is disturbed by the first write operation according to the cell current of the second cell.

3. The storage device as claimed in claim 2, wherein:
in response to the cell current of the second cell deviating from an erase range, the disturb-free circuit performs an erase operation on the second cell, and
in response to the cell current of the second cell deviating from a program range, the disturb-free circuit performs a program operation on the second cell.

4. The storage device as claimed in claim 3, wherein:
after performing the first write operation on the first cell, the disturb-free circuit reads the data stored in the second cell,
in response to the data stored in the second cell being equal to a specific value, the disturb-free circuit compares the cell current of the second cell with a first threshold, and in response to the cell current of the second cell being less than the first threshold value, the disturb-free circuit performs the erase operation on the second cell,
in response to the data stored in the second cell not being equal to the specific value, the disturb-free circuit compares the cell current of the second cell with a second threshold value, and in response to the cell current of the second cell being higher than the second threshold value, the disturb-free circuit performs the program operation on the second cell.

5. The storage device as claimed in claim 3, wherein in response to the cell current of the second cell going back to the erase range or the program range, the disturb-free circuit performs the verification operation on the first cell.

6. The storage device as claimed in claim 1, wherein:
the first cell comprises a first transistor and the second cell comprises a second transistor,
a gate of the first transistor and a gate of the second transistor are coupled to the specific conductive line, and
a drain of the first transistor is coupled to the first conductive line and a drain of the second transistor is coupled to the second conductive line.

7. The storage device as claimed in claim 6, wherein the cell array further comprises:
a third cell comprising a third transistor which has a drain coupled to the first conductive line,
wherein:
the disturb-free circuit performs the verification operation on the third cell to confirm whether the data stored in the third cell is disturbed by the first write operation, and
in response to the data stored in the third cell being disturbed by the first write operation, the disturb-free circuit performs a third write operation on the third cell according to the data stored in the third cell.

8. The storage device as claimed in claim 1, wherein:
the first cell comprises a first transistor and the second cell comprises a second transistor, a drain of the first transistor and a drain of the second transistor are coupled to the specific conductive line,
a gate of the first transistor is coupled to the first conductive line and a gate of the second transistor is coupled to the second conductive line.

9. The storage device as claimed in claim 8, wherein the cell array further comprises:
a third cell comprising a third transistor, which has a gate coupled to the first conductive line,
wherein:
the disturb-free circuit performs the verification operation on the third cell to confirm whether data stored in the third cell is disturbed by the first write operation,
in response to the data stored in the third cell being disturbed by the first write operation, the disturb-free circuit performs a third write operation on the third cell.

10. The storage device as claimed in claim 1, wherein the disturb-free circuit determines whether a specific event occurs, and in response to the specific event not occurring, the disturb-free circuit does not perform the verification operation.

11. The storage device as claimed in claim 10, wherein the specific event is that the number of times that data is written to the cell array reaches a target value.

12. A control method applied to a storage device comprising a cell array which comprises a plurality of cells, comprising:
selecting one of the cells;
performing a first write operation on the selected cell;
performing a verification operation on an un-selected cell among the cells to determine whether data stored in the un-selected cell is disturbed by the first write operation; and
performing a second write operation on the un-selected cell in response to the data stored in the un-selected cell being disturbed by the first write operation,
wherein the un-selected cell and the selected cell are coupled to a specific conductive line.

13. The control method as claimed in claim 12, wherein the verification operation comprises:
reading the data stored in the un-selected cell; and
reading a cell current of the un-selected cell.

14. The control method as claimed in claim 13, wherein the verification operation further comprises:
determining whether the data stored in the un-selected cell is equal to a specific value;
determining whether the cell current of the un-selected cell deviates from an erase range in response to the data stored in the un-selected cell being equal to the specific value;
performing an erase operation on the un-selected cell in response to the cell current of the un-selected cell deviating from the erase range;
determining whether the cell current of the un-selected cell deviates from a program range in response to the data stored in the un-selected cell not being equal to the specific value; and
performing a program operation in response to the cell current of the un-selected cell deviating from the program range.

15. The control method as claimed in claim 14, wherein the step of determining whether the cell current of the un-selected cell deviates from the erase range comprises:
comparing the cell current of the un-selected cell and a first threshold value, wherein the cell current of the un-selected cell being less than the first threshold means that the cell current of the un-selected cell deviates from the erase range.

16. The control method as claimed in claim 15, wherein the step of determining whether the cell current of the un-selected cell deviates from the program range comprises:
comparing the cell current of the un-selected cell and a second threshold value,
wherein the cell current of the un-selected cell being higher than the second threshold value means that the cell current of the un-selected cell deviates from the program range, and the first threshold is higher than the second threshold value.

17. The control method as claimed in claim 14, wherein the step of determining whether data stored in the un-selected cell is equal to the specific value comprises:
comparing the cell current of the un-selected cell and a reference current,
wherein:
the cell current of the un-selected cell being higher than the reference current means that the data stored in the un-selected cell is equal to the specific value, and
the cell current of the un-selected cell being less than the reference current means that the data stored in the un-selected cell is not equal to the specific value.

18. The control method as claimed in claim 14, further comprising:
performing the verification operation on the selected cell.

19. The control method as claimed in claim 12, further comprising:
determining whether a specific event occurs,
wherein the verification operation is not performed in response to the specific event not occurring.

20. The control method as claimed in claim 19, wherein the specific event is that the number of times that the data is written to the cell array reaches the target value.

\* \* \* \* \*